(12) United States Patent
Slaton (10) Patent No.: US 8,047,853 B2
(45) Date of Patent: Nov. 1, 2011

(54) PRINTED CIRCUIT BOARD WITH AN ADAPTABLE CONNECTOR MODULE

(75) Inventor: David S. Slaton, Huntsville, AL (US)

(73) Assignee: GE Intelligent Platforms, Inc., Charlottesville, VA (US)

(*) Notice: Subject to any disclaimer, the term of this patent is extended or adjusted under 35 U.S.C. 154(b) by 0 days.

(21) Appl. No.: 12/399,608

(22) Filed: Mar. 6, 2009

(65) Prior Publication Data

US 2010/0225306 A1    Sep. 9, 2010

(51) Int. Cl.
*H01R 12/00* (2006.01)
(52) U.S. Cl. .......................... 439/60; 439/518
(58) Field of Classification Search ............... 439/541.5, 439/60, 518
See application file for complete search history.

(56) References Cited

U.S. PATENT DOCUMENTS

| | | | | |
|---|---|---|---|---|
| 5,259,783 A | * | 11/1993 | Hileman et al. | 439/372 |
| 5,892,658 A | * | 4/1999 | Urda et al. | 361/704 |
| 5,949,656 A | * | 9/1999 | Pinault | 361/788 |
| 5,984,734 A | | 11/1999 | Piper et al. | |
| 6,109,977 A | * | 8/2000 | Baxter et al. | 439/693 |
| 6,902,427 B2 | * | 6/2005 | Kuo | 439/502 |
| 7,255,570 B1 | * | 8/2007 | Feldman et al. | 439/64 |

OTHER PUBLICATIONS

American National Standard for VXS VMEbus Switches Serial Standard, VMEbus International Trade Association, Fountain Hills, AZ, ANSI/VITA 41.0-2006.
Kelvin Aist, Tech Talk "Are VMEbus & VME64X Really Compatible" (Part 2 of 4), Sierra Sales Incorporated, Apr. 2005, http://sierrasales.com/articles/Article3b-VME64X.html.
VITA Standards Organization, Scottsdale, AZ, Serial I/O on 2 mm Connectors Draft Standard VITA 31-200x Draft 0.5 Jan. 9, 2001.

* cited by examiner

*Primary Examiner* — Truc Nguyen
(74) *Attorney, Agent, or Firm* — GE Global Patent Operation; Mark A. Conklin

(57) ABSTRACT

A printed circuit board including a P1 connector, a P2 connector, and a first common connector configured to connect an application-specific connector to the printed circuit board.

20 Claims, 11 Drawing Sheets

PRINTED CIRCUIT BOARD WITH AN ADAPTABLE CONNECTOR MODULE

BACKGROUND OF THE INVENTION

The embodiments described herein are related to a printed circuit board with a modular application-specification connection.

Printed circuit boards (PCB) and peripheral devices typically conform to standards specified by industry. These standards define PCB dimensions, as well as types of connector and locations of connectors with respect to the PCB. For example, VMEbus International Trade Association (VITA) has defined a standard for modular circuit packaging commonly known as the "Versa Module Europa" (VME), a flexible environment supporting a variety of computing intensive tasks, and has become a rather popular protocol in the computer industry. VME incorporates a number of design standards such as IEEE standard 1101.1, IEEE standard 1101.2, VITA20, ANSI/VITA1, VITA1.1 (VME64X) and IEEE standard P1386.

Figure 1:
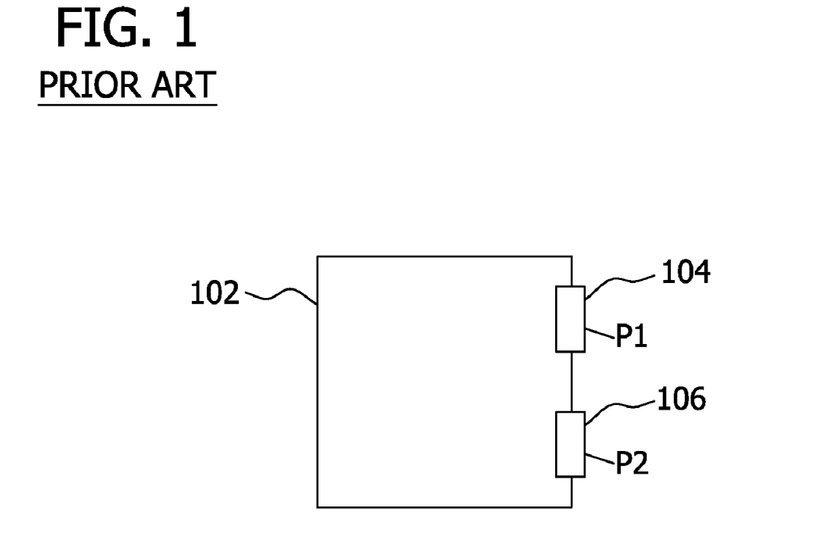
FIG. 1 shows a conventional VME board.

Standard connector types for a VME board 102 include a first connector "P1" at a location 104 and a second connector "P2" at a location 106, respectively, as shown in FIG. 1. Another standard "VITA 31" defines a use of a third connector "P0" located between first connector "P1" and second connector "P2". The P0 connecter is configured to route serial fabric signals, such as Ethernet signals, to a "VITA 31" backplane.

A standard "VITA 41" defines a use of a P0 connector and a keying pin in a same general area on the VME board 102 as the VITA 31 P0 connector. The VITA 41 P0 connector performs similar functions as the VITA 31 P0 connector, however, the VITA 41 is a significantly different type of connector meant to support higher-speed fabrics.

PCBs designed for VITA 31 P0 connector may not plug physically into many standard VME backplanes due to interference between the VITA 31 P0 connector and mechanical structures in a VME backplane. Further, a VITA 41 P0 connector also presents compatibility problems with VME backplanes. In addition, a VITA 41 P0 connector cannot be used in a VITA 31 backplane and, likewise, a VITA 31 P0 connector may not be used in a VITA 41 backplane.

As a result, PCB vendors offer three different ordering options. A PCB without a P0 connector, a PCB with a VITA 31 P0 connector, and a PCB with a VITA 41 P0 connector. Support of extra ordering options for excluding a P0 connector or including a particular P0 connector adds cost to building PCBs as a specific PCB must be designed for each scenario and, thus, adds unnecessary costs of development of several different types of PCBs.

BRIEF DESCRIPTION OF THE INVENTION

In one aspect, a printed circuit board is provided. The printed circuit board includes a P1 connector, a P2 connector, and a first common connector configured to connect an application-specific connector to the printed circuit board.

In another aspect, a method for detecting a module installed on a printed circuit board is provided. The method includes utilizing a first pin on a board-to-board connector to indicate that the module is installed on the printed circuit board, and utilizing a second pin on the board-to-board connector to indicate a type of application-specific connector installed on the module.

In yet another aspect a module configured to connect a Rear Transition Module (RTM) board to a front board is provided. The module includes a first connector configured to connect to a third connector of the RTM board, and a second connector configured to connect to a fourth connector of the front board.

BRIEF DESCRIPTION OF THE DRAWINGS

The present disclosure is described in detail below with reference to the attached drawing figures.

DETAILED DESCRIPTION OF THE INVENTION

Although the present disclosure describes a modular application-specific connection adaptable to accept a P0 connection from either a VITA 31 P0 module or a VITA 41 P0 module, the present disclosure is not limited to these embodiments and can be applied to other printed circuit boards with modular application-specification connections, for example, a modular application-specific connection adaptable to accept a "Zone 3" connection from a variety of AdvancedTCA "Zone 3" implementations.

As described above, printed circuit boards (PCB) and peripheral devices typically conform to standards specified by industry. A Versatile Modular E-bus (VMEbus) is an industry standard multiprocessor system bus that uses a 32 bit address and data bus for communication between various "Versa Module Europa" (VME) cards. The VME standard bus provides a maximum number of 21 VME card slots. The VMEbus includes two rows of female connectors providing access to a first connector (e.g., a P1 connector) at location 104 and a second connector (e.g., a P2 connector) at location 106. The VMEbus backplane provides female connectors on a front face for receiving standard VME cards in a plurality of slots. The VMEbus also provides male connectors on a back side of the backplane for each slot. Male connectors are configured to couple VME cards to corresponding transition cards via ribbon cables. The VME transition cards are configured to couple a shelf to other systems through interfaces such as Ethernet, and a SCSI bus for disk drives.

Figure 2:
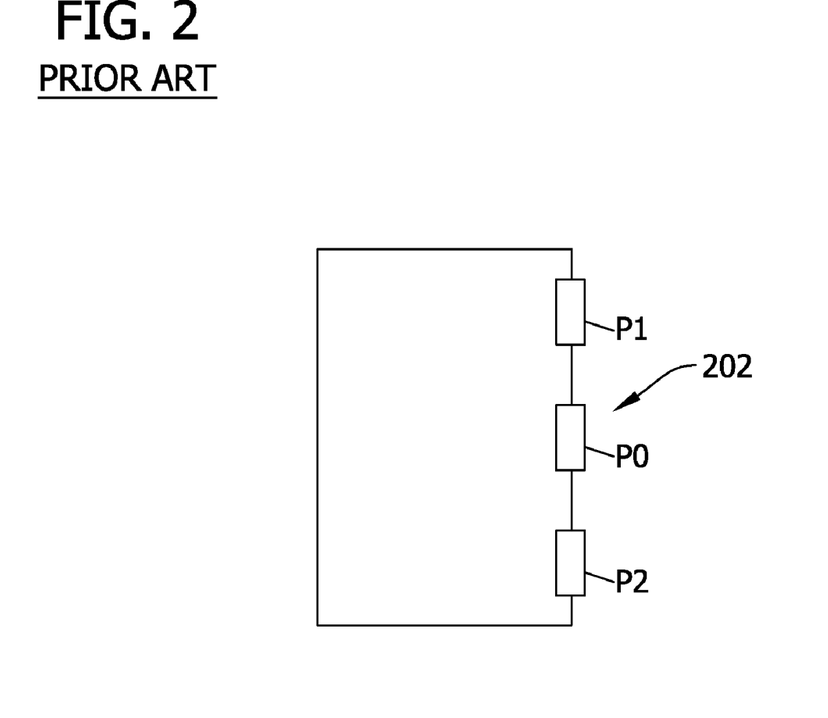
FIG. 2 shows a VME board including a VITA 31 P0 connector.
Figure 3:
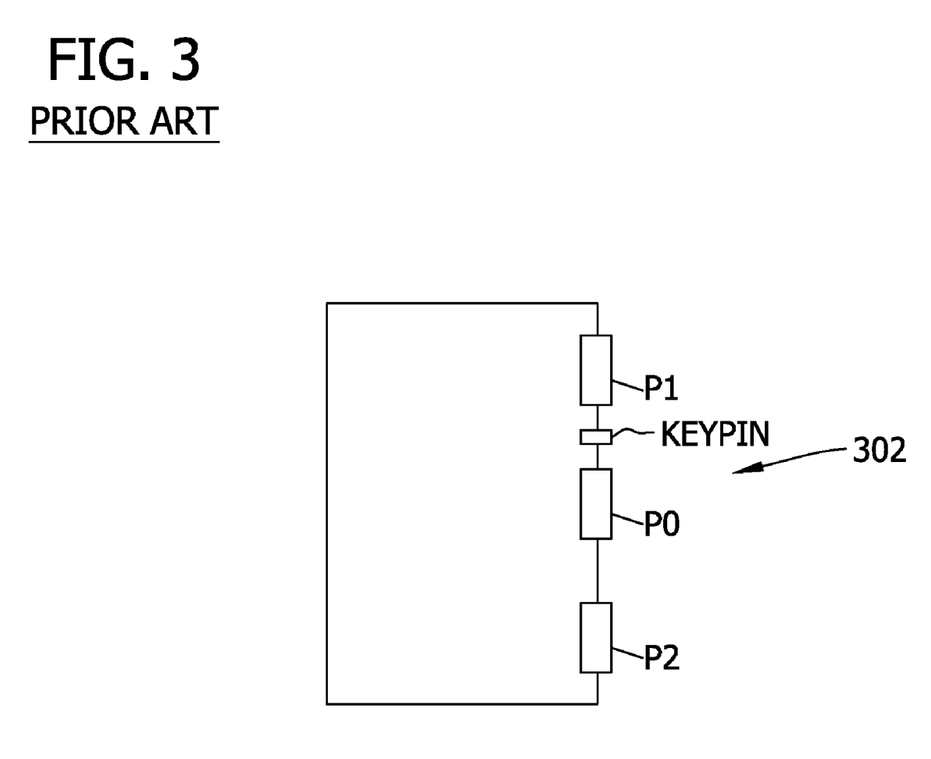
FIG. 3 shows a VME board including a VITA 41 P0 connector.

With reference now to FIG. 2, a PCB with an application-specific connector (e.g., a VITA 31 P0 connector) is generally shown at 202 between a first connector "P1" and a second connector "P2." With reference now to FIG. 3, a PCB with an application-specific connector (e.g., a VITA 41 P0 connector) and a keying pin is generally shown at 302 between a first connector "P1" and second connector "P2."

Figure 4:
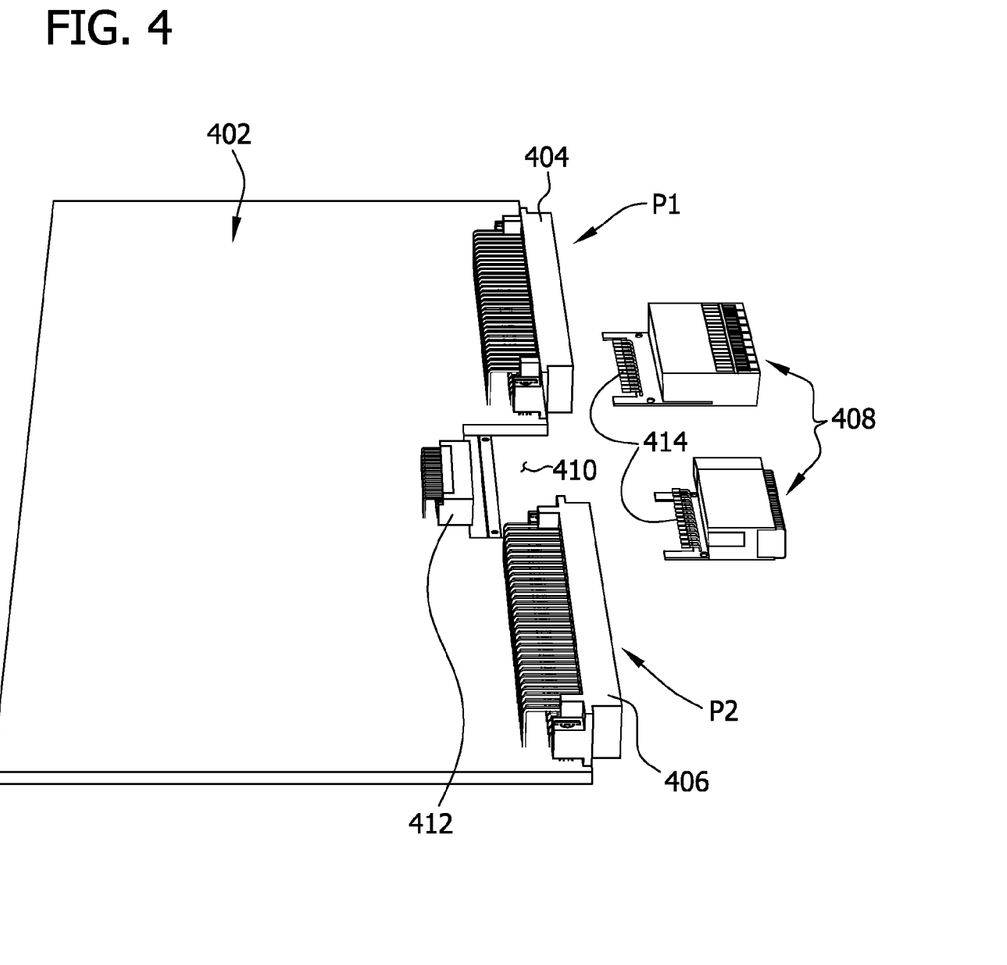
FIG. 4 shows an exemplary printed circuit board with an adaptable P0 module.
Figure 5:
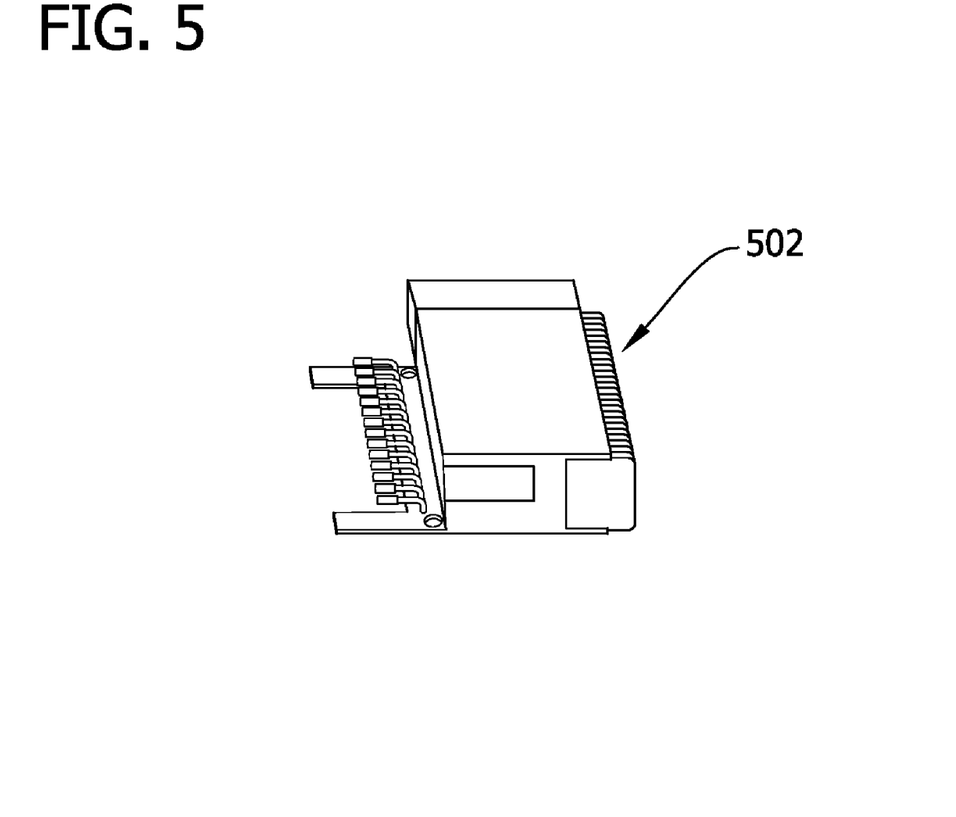
FIG. 5 shows a VITA 41 module.
Figure 6:
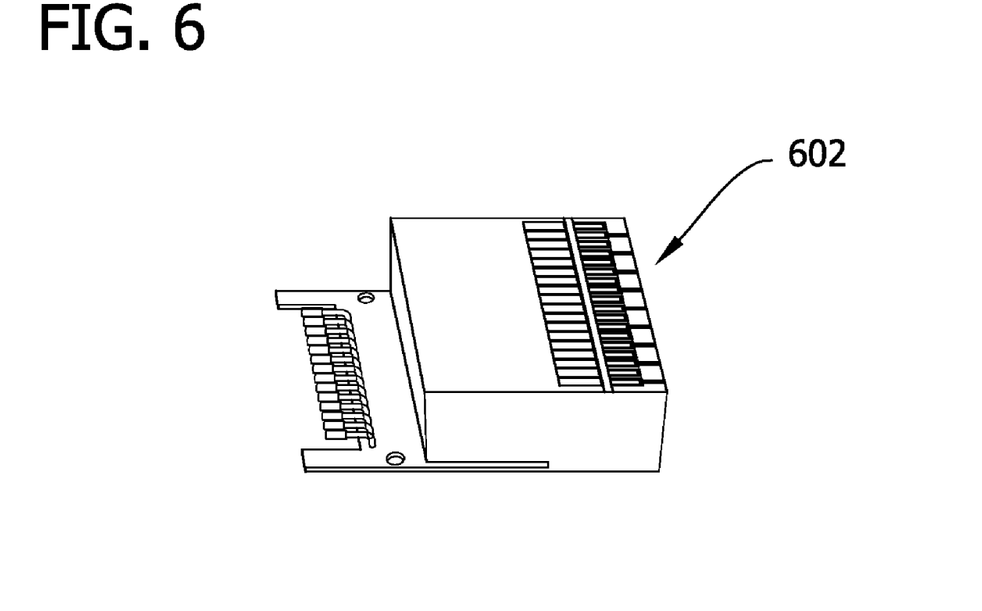
FIG. 6 shows a VITA 31 module.
Figure 7:
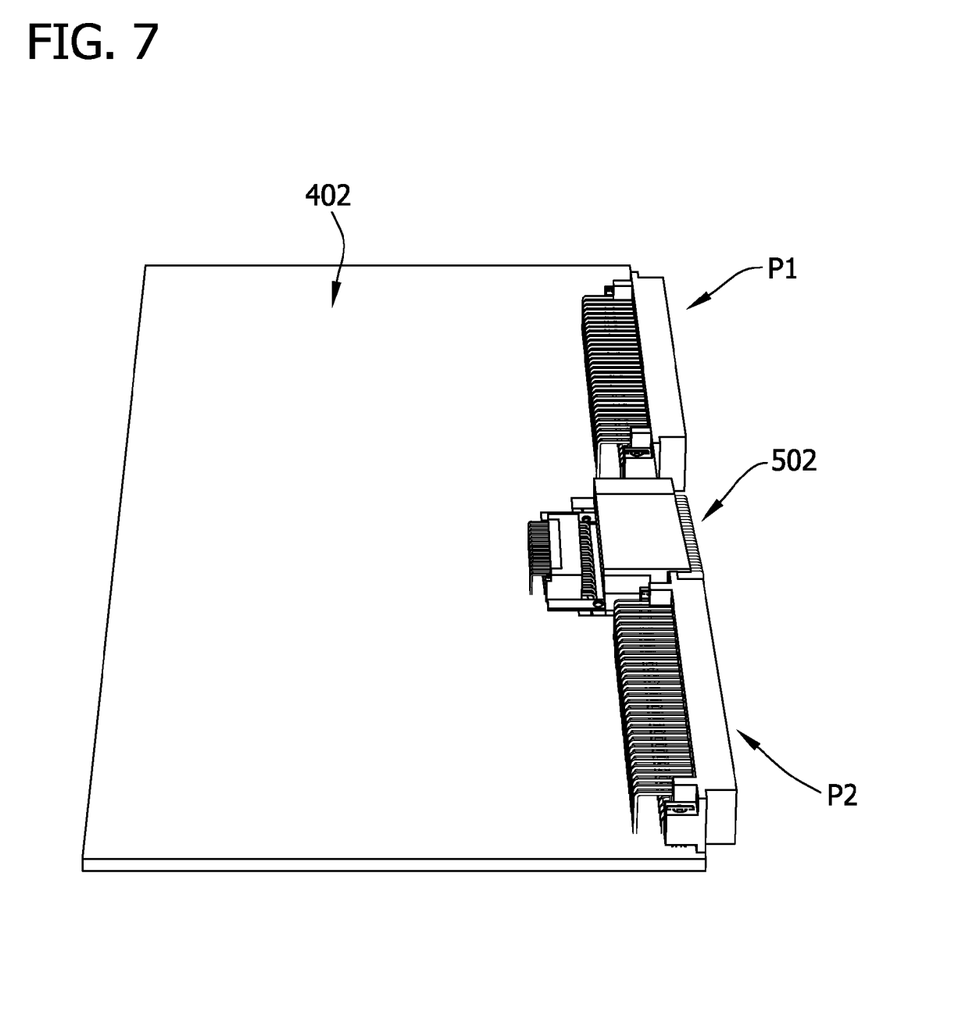
FIG. 7 shows an exemplary printed circuit board with a VITA 41 module.
Figure 8:
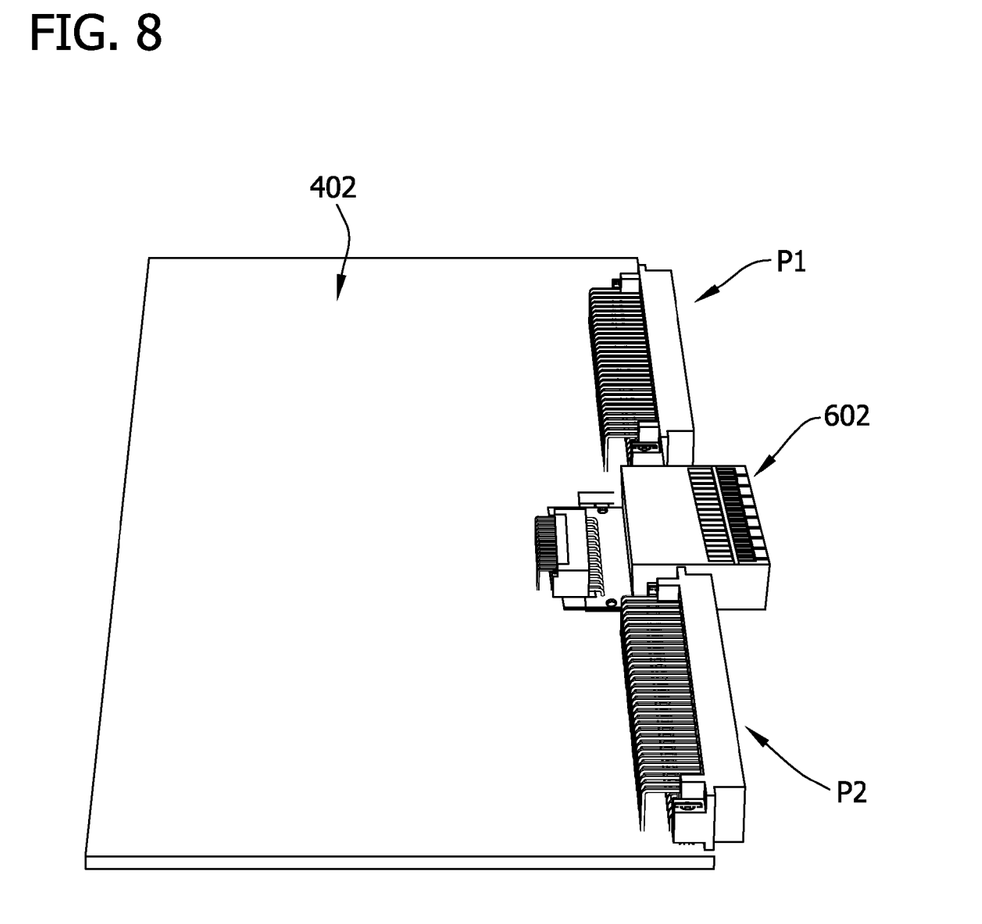
FIG. 8 shows an exemplary printed circuit board with a VITA 31 module.

FIG. 4 illustrates an exemplary VME board 402 with a cutout area 410 configured to connect a module 408 on VME board 402 to a first common connector 412. In one embodiment, cutout area 410 has dimensions suitable to receive a module, for example a P0 connector. As shown in FIG. 4, first common connector 412 is positionable between a P1 connector 404 and a P2 connector 406 at cutout area 410. FIGS. 5 and 6 show an illustrative example of a VITA 41 module 502 and a VITA 31 module 602, respectively, each suitable for use with VME board 402. For example, FIG. 7 shows VITA 41 P0 module 502 coupled to VME board 402, and FIG. 8 shows a VITA 31 module 602 coupled to VME board 402.

With reference back to FIG. 4, in one embodiment, cutout area 410 on VME board 402 includes first common connector 412 that provides connectivity for both a VITA 31 P0 module and a VITA 41 P0 module via a second common connector 414 on each of the Vita 31 P0 module and the Vita 41 P0 module. Therefore, utilizing the fact that Ethernet signals on both the VITA 31 P0 module and the VITA 41 P0 module are similar, module 408 is configured to allow VME board 402 to be compatible with a standard VME in a legacy backplane, a VITA 31 backplane, and a VITA 41 backplane. Therefore, only one type of PCB that is compatible with all three environments is necessary, in contrast to conventional PCBs that are compatible with only one of the three environments.

A PCB, for example VME board 402, that includes first common connector 412 configured to connect to the second common connector of module 408, for example, a Vita 31 module or a Vita 41 module, allows a customer to decide at any time to reconfigure VME board 402 for operation in any one of the supported chassis, VME legacy, VITA 31, or VITA 41. Further, a customer may order a PCB without a need for determining a particular standard, for example, VME legacy, VITA 31, or VITA 41. Thus, a single product configuration may be created which supports the three standards: VME legacy, VITA 31, and VITA 41. This reduces inventory and risk associated with forecast ordering from a factory. Instead, the risk of determining which VME option to build is mitigated by allowing a customer to purchase, separately, a module which provides a specific P0 functionality needed, or purchase no module at all when an intended use is in, for example, a legacy VME system.

Thus, provided herein is a migration path to a customer. A customer may elect to order, for example, a v7875 in a legacy configuration (e.g., with no P0 connector) and later migrate the product to a VITA 31 or VITA 41 by purchasing an appropriate module. Additionally, the customer may remove a PCB from a VITA 31 chassis and use it in a VITA 41 chassis by installing a proper module. This provides a customer flexibility over competing products, where the P0 option is established at a time of an order by the customer and cannot be changed afterwards. Thus, a single product can be created that supports each of three existing VME configurations: VME legacy; VITA 31, and VITA 41. This saves the cost of at least one PCB layout allowing for overall product cost savings.

Figure 9:
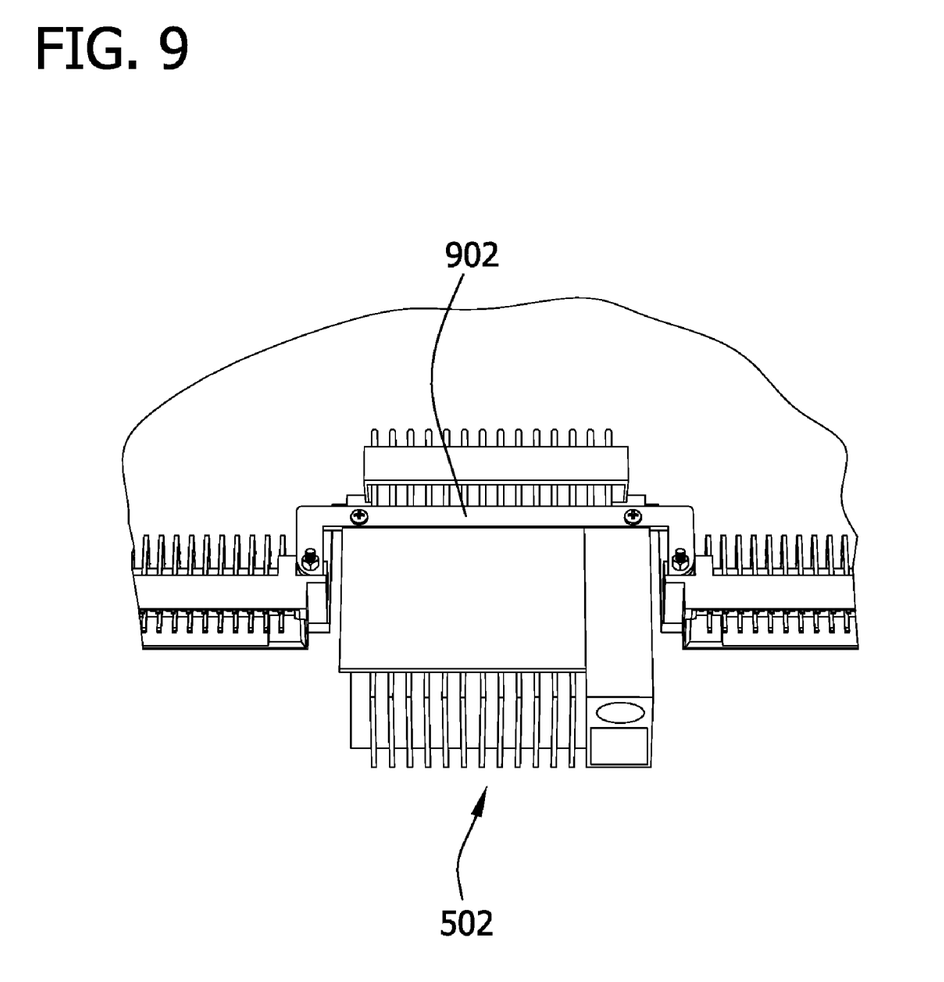
FIGS. 9 and 10 show a bracket system on a printed circuit board.
Figure 10:
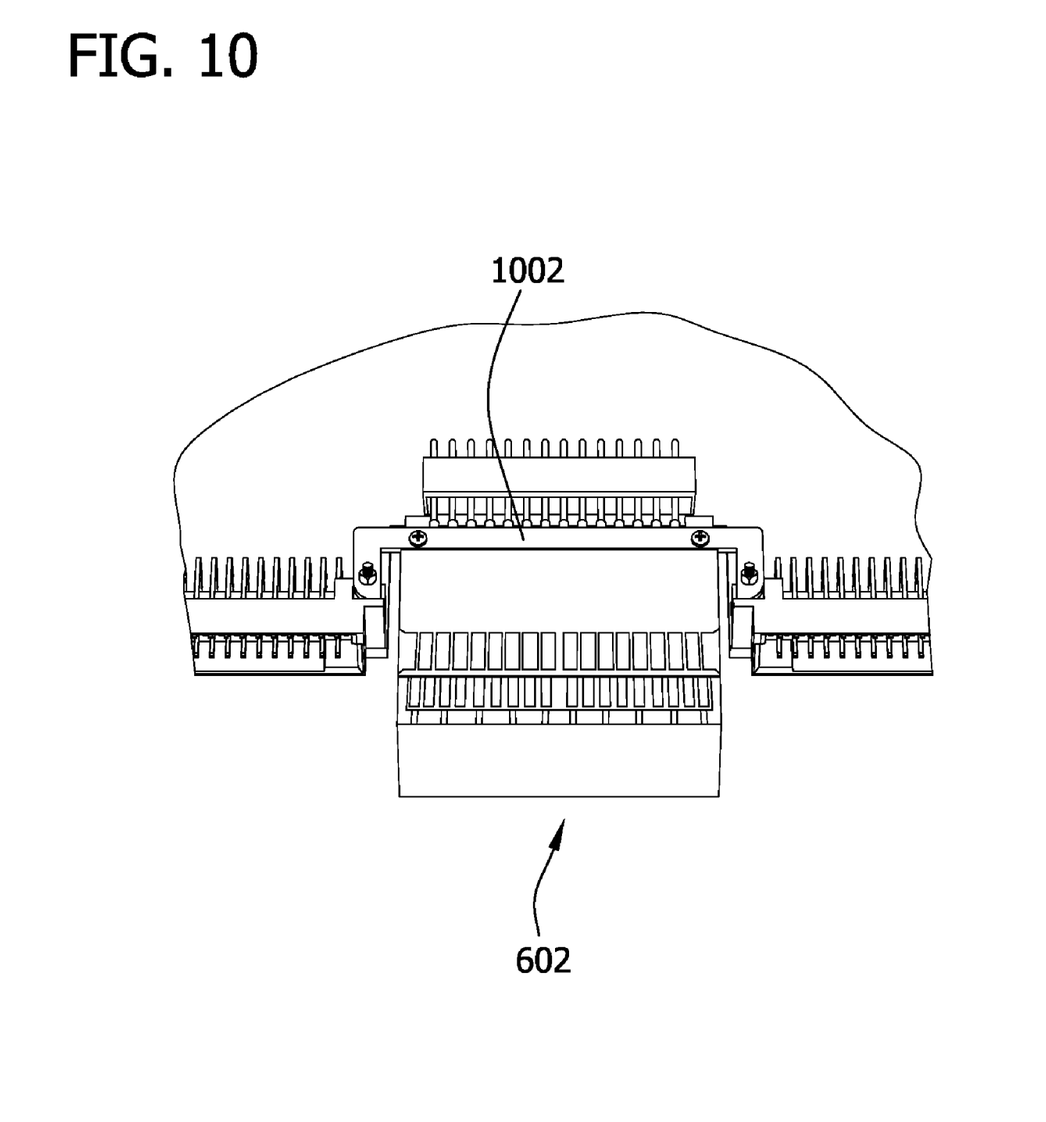

In a further embodiment, and with reference now to FIGS. 9 and 10, a bracket 902 and 1002, respectively, is configured to channel insertion/extraction forces, as well as forces seen during shock/vibe, away from first common connector 412 and into a PCB. Furthermore, when a module is not installed, bracket system 902 and 1002 may also support a PCB in an area between a P1 connector and a P2 connector. In one embodiment, bracket 902 and 1002 may include retention screws 904 and 1004, respectively, to secure bracket 902 and 1002 to a PCB.

Figure 11:
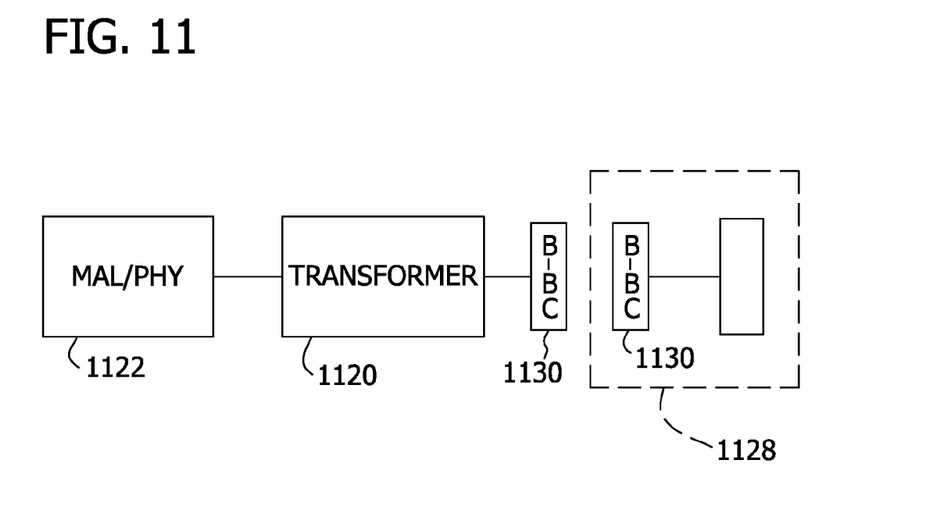
FIGS. 11, 12, and 13 are block diagrams illustrating connectivity between a P0 connector and a printed circuit board.
Figure 12:
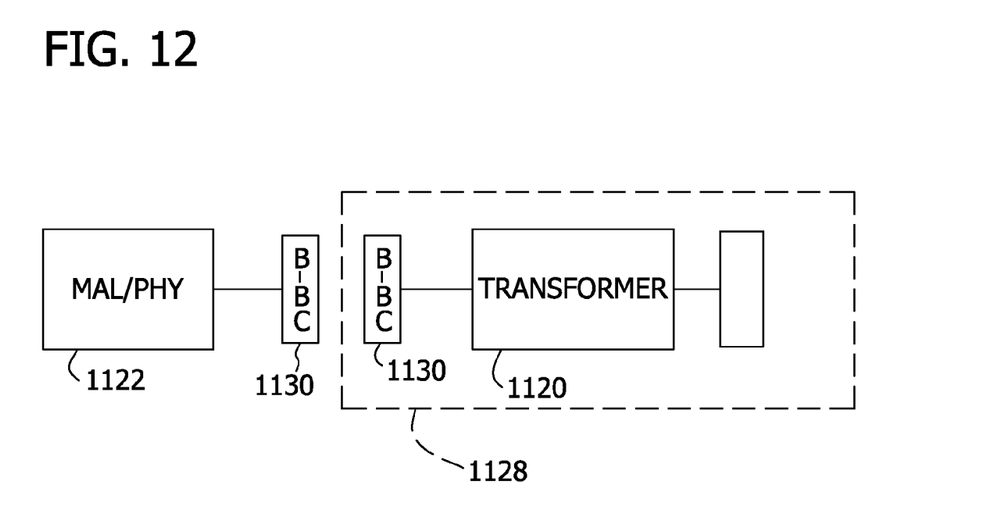
Figure 13:
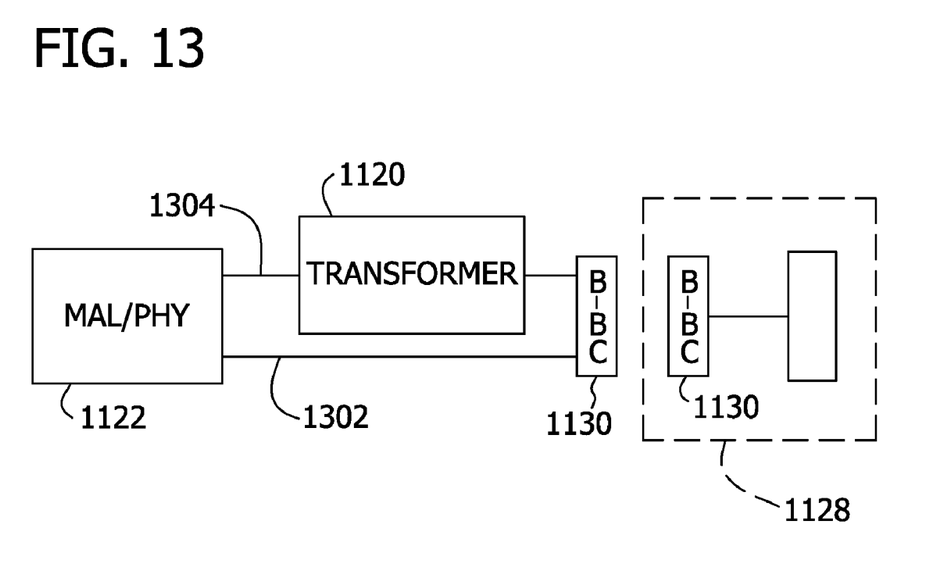

With reference now to FIG. 11, in one embodiment, common connectors, for example, board-to-board connectors 1130 carry signals used by both a VITA 31 module and a VITA 41 module. However, a VITA 31 module utilizes "Media Dependent Interface" (MDI) signals that are required to pass through a transformer circuit 1120, from a media access controller (MAC/PHY) 1122 (e.g., an Ethernet controller). In one embodiment, transformer circuit 1120 provides signal isolation, impedance matching to cables, and filtration. In a further embodiment, as shown in FIG. 11, transformer circuit 1120 may be placed on a PCB. In a further embodiment, and as shown in FIG. 12, the transformer circuit 1120 may be placed on a P0 module 1128. In contrast, VITA 41 utilizes "Serializer/Deserializer" (SERDES) signals that consist of two differential pairs per channel that are available from MAC/PHY 1122, and thus transformer circuit 1120 is not necessary to send a signal from MAC/PHY 1122 to a VITA 41 module. Thus, as shown in FIG. 13, an alternative embodiment to that of FIG. 11, includes two signal lines extending from MAC/PHY 1122 to board-to-board connectors 1130. A first line 1302 extending from MAC/PHY 1122 to board-to-board connectors 1130 that does not include transformer 1120 (e.g., a serdes signal line), and a second line 1304 extending from MAC/PHY 1122 to board-to-board connectors 1130 that includes transformer 1120 (e.g., a signal line).

Figure 14:
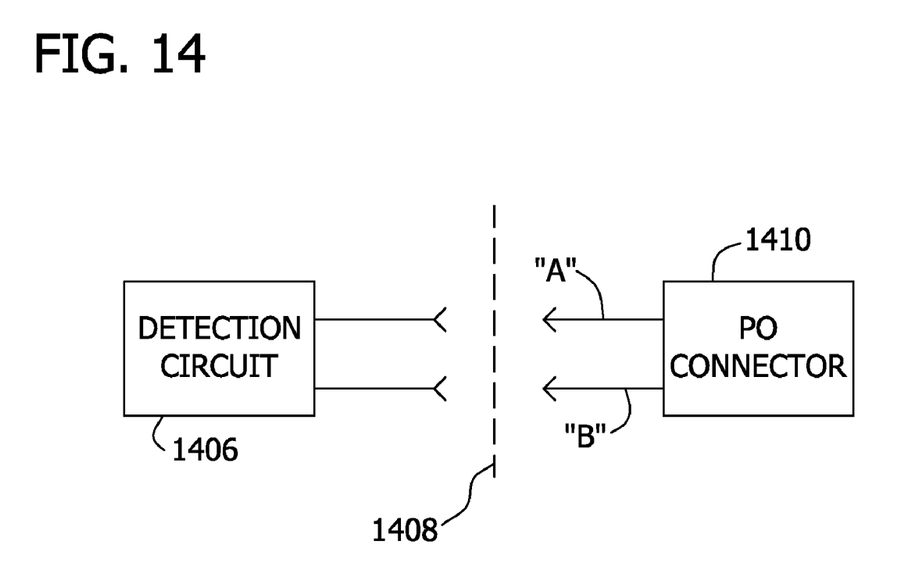
FIG. 14 is a block diagram illustrating detector pins on a detection circuit.

In one embodiment, in order to identify if a P0 connector is coupled to a PCB and/or to facilitate control of which signals to enable on the PCB based on a type of P0 connector installed, two pins on a board-to-board connector, shown in FIG. 14 as "A" and "B," may be designated as "presence" signals. That is, a pin designated as "A" detects a presence of a P0 connector (e.g., 0=module present; 1=module absent) and a pin designated as "B" recognizes a type of the P0 connector (e.g., 0=VITA 31; 1=VITA 41). A detection circuit 1406 may determine that a P0 connector is present and further, what type of P0 connector 1410 is installed and drive appropriate Ethernet signals (as described above) through board-to-board connector interface 1408.

Figure 15:
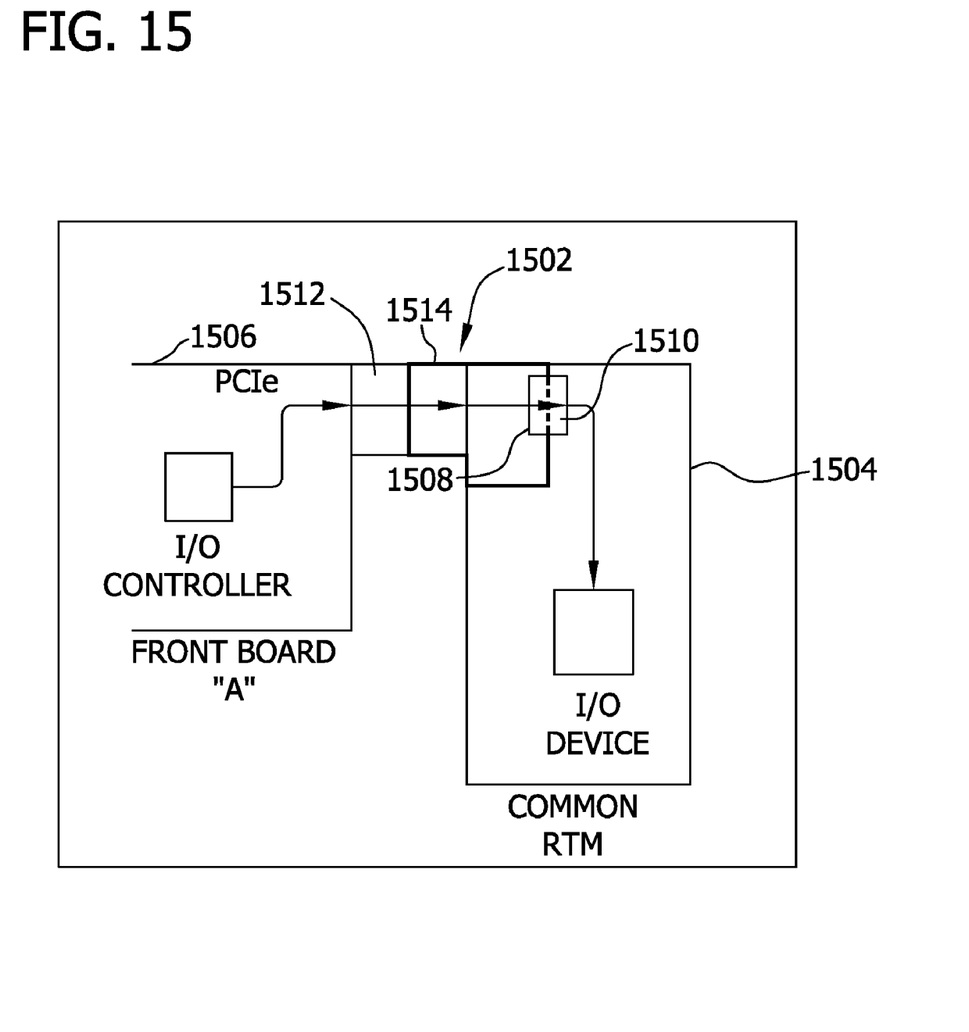
FIG. 15 shows an exemplary module configured to connect a Rear Transition Modular board with a front board.

As mentioned above, although the present disclosure describes a modular application-specific connection adaptable to accept a P0 connection from either a VITA 31 P0 module or a VITA 41 P0 module, the present disclosure is not limited to these embodiments and can be applied to other printed circuit boards with modular application-specification connections, for example, a modular application-specific connection adaptable to accept a "Zone 3" connection from a variety of AdvancedTCA "Zone 3" implementations. With reference now to FIG. 15, a module 1502 configured to connect a Rear Transition Module (RTM) board 1504 to a front board 1506 is shown.

Module 1502 includes a first connector, for example, a first common connector 1508 configured to connect to a connector, for example, common connector 1510 of RTM board 1504. Module 1502 further includes a second connector (i.e., "Zone 3" connector), for example, first application-specific connector 1514 configured to connect to a connector, for example, application-specific connector 1512 of front board 1506.

The above embodiment thus allows a common RTM, for example RTM 1504, to be connected to several different types of front boards (e.g., front boards that include different application-specific connectors) via an appropriate module, for example module 1502. That is, each module 1502 includes a common connecter, for example, first common connector 1508, that is configured to connect to common connector 1510 of RTM 1504. However, the type of module chosen will depend upon which front board is to be connected to the common RTM. That is, each front board has an application-specific connector, for example, application-specific connector 1512. Thus, a module that includes an application-specific connector configured to connect to application-specific connector 1512 of front board 1506 will be chosen to connect front board 1506 to RTM 1504. This allows a customer that has purchased a specific front board that includes an application-connector that is incompatible with a connector on a RTM to purchase an appropriate module that includes an application-specific connector that is compatible with the application-specific connector on the front board, as well as a connector that is compatible with the connector of the RTM.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A printed circuit board comprising:
a first connector and a second connector; and
a first common connector configured to connect an application-specific module to the printed circuit board, the first common connector having at least a first and second pin, the first pin configured to detect a presence of the module, and the second pin configured to detect which application of a plurality of applications the module is specific to;
wherein the module is configured to connect the printed circuit board to a backplane such that the printed circuit board is compatible with detected application in the module.

2. A printed circuit board in accordance with claim 1, further comprising a cutout area defined by the printed circuit board between the first connector and the second connector.

3. A printed circuit board in accordance with claim 1, wherein the printed circuit board is a Versa Module Europa type board.

4. A printed circuit board in accordance with claim 1, further comprising a right-angle board-to-board connector to connect the module to the first common connector.

5. A printed circuit board in accordance with claim 1, wherein the application-specific module is a VITA 31 P0 module.

6. A printed circuit board in accordance with claim 1, wherein the application-specific module is a VITA 41 P0 module.

7. A printed circuit board in accordance with claim 1, further comprising a bracket configured to facilitate connecting the first common connector to the module.

8. A printed circuit board in accordance with claim 1, further comprising a detection circuit configured to detect installation of the module via the first common connector and a type of the module.

9. A printed circuit board in accordance with claim 5, wherein the VITA 31 P0 module comprises a second common connector configured to connect to the first common connector.

10. The printed circuit board in accordance with claim 6, wherein the VITA 41 P0 module comprises a second common connector configured to connect to the first common connector.

11. A method for detecting a module installed on a printed circuit board, the method comprising:
installing the module on the printed circuit board using a first common connector provided on the printed circuit board, the first common connector configured to connect to a second common connector provided on the module;
utilizing a first pin on the first common connector to indicate that the module is installed on the printed circuit board; and
utilizing a second pin on the first common connector to detect which application of a plurality of applications the module installed on the printed circuit board is specific to.

12. A method in accordance with claim 11, wherein the printed circuit board is a Versa Module Europa board or a Rear Transition Module board.

13. A method in accordance with claim 11, wherein installing the module comprises installing a VITA 31 module to the printed circuit board.

14. A method in accordance with claim 13, further comprising sending a Media Dependent Interface signal from the printed circuit board to the VITA 31 module.

15. A method in accordance with claim 11, wherein installing the module comprises installing a VITA 41 module to the printed circuit board.

16. A method in accordance with claim 15, further comprising sending a Serializer/Deserializer signal from the printed circuit board to the VITA 41 module.

17. A method in accordance with claim 11, wherein installing the module comprises installing a zone 3 connector to the printed circuit board.

18. A module configured to connect a Rear Transition Module (RTM) board to a front board, the module comprising:
a common connector configured to connect to a corresponding common connector of the RTM board, the common connector having at least a first and second pin, the first pin configured to detect a presence of a module having an application-specific connector, and the second pin configured to detect which application of a plurality of applications the module is specific to;
wherein the module comprises an application-specific connector configured to connect to a corresponding application-specific connector of the front board.

19. A module in accordance with claim 18, wherein the application-specific connector is a zone 3 connector.

20. A printed circuit board in accordance with claim 8, wherein the the first pin and a second pin are connected to a detection circuit, the detection circuit further configured to transmit a first signal via the first pin to detect the installation of the module and to transmit a second signal via the second pin to detect the type of the module.

* * * * *